(12) United States Patent
Erdogan et al.

(10) Patent No.: US 8,643,619 B2
(45) Date of Patent: Feb. 4, 2014

(54) CONTINUOUS TIME CORRELATOR ARCHITECTURE

(75) Inventors: Ozan E. Erdogan, Sunnyvale, CA (US); Guozhong Shen, San Jose, CA (US); Rajesh Anantharaman, San Jose, CA (US); Ajay Taparia, Santa Clara, CA (US); Behrooz Javid, Irvine, CA (US); Syed T. Mahmud, Dublin, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 163 days.

(21) Appl. No.: 13/404,594

(22) Filed: Feb. 24, 2012

(65) Prior Publication Data

US 2012/0218223 A1 Aug. 30, 2012

Related U.S. Application Data

(60) Provisional application No. 61/446,944, filed on Feb. 25, 2011.

(51) Int. Cl.
*G06F 3/041* (2006.01)

(52) U.S. Cl.
USPC .................. 345/173; 178/18.06; 324/658

(58) Field of Classification Search
USPC ............. 345/173–183; 178/18.01–18.11, 178/19.01–19.07, 20.01–20.04; 324/658–690
See application file for complete search history.

(56) References Cited

U.S. PATENT DOCUMENTS

| | | | |
|---|---|---|---|
| 4,949,398 A * | 8/1990 | Maas | 455/326 |
| 5,329,316 A * | 7/1994 | Kang | 348/625 |
| 5,799,248 A * | 8/1998 | Vice | 455/333 |
| 6,043,943 A * | 3/2000 | Rezzi et al. | 360/46 |
| 7,482,870 B2 * | 1/2009 | Maejima et al. | 330/207 P |
| 7,898,329 B1 * | 3/2011 | Clara et al. | 330/254 |
| 8,031,094 B2 * | 10/2011 | Hotelling et al. | 341/143 |
| 2002/0072770 A1 * | 6/2002 | Pless | 607/2 |
| 2002/0077670 A1 * | 6/2002 | Archer et al. | 607/45 |
| 2003/0184356 A1 * | 10/2003 | Wang et al. | 327/258 |
| 2005/0164669 A1 * | 7/2005 | Molnar et al. | 455/320 |
| 2005/0275026 A1 * | 12/2005 | Tsividis et al. | 257/350 |
| 2006/0141976 A1 * | 6/2006 | Rohde et al. | 455/326 |
| 2006/0194560 A1 * | 8/2006 | Shu | 455/326 |
| 2007/0257890 A1 * | 11/2007 | Hotelling et al. | 345/173 |
| 2008/0157867 A1 * | 7/2008 | Krah | 329/304 |
| 2008/0252367 A1 * | 10/2008 | Pettersen et al. | 329/311 |
| 2009/0251196 A1 * | 10/2009 | Tsividis et al. | 327/355 |
| 2009/0315850 A1 * | 12/2009 | Hotelling et al. | 345/173 |
| 2009/0315851 A1 * | 12/2009 | Hotelling et al. | 345/173 |
| 2009/0318095 A1 * | 12/2009 | Shu | 455/84 |
| 2010/0066473 A1 * | 3/2010 | Fahs | 336/30 |
| 2012/0217981 A1 * | 8/2012 | Erdogan et al. | 324/679 |
| 2012/0218020 A1 | 8/2012 | Erdogan et al. | |
| 2012/0218223 A1 * | 8/2012 | Erdogan et al. | 345/174 |
| 2012/0274404 A1 | 11/2012 | Erdogan et al. | |
| 2013/0069905 A1 * | 3/2013 | Krah et al. | 345/174 |
| 2013/0088245 A1 * | 4/2013 | Sezginer | 324/679 |
| 2013/0162586 A1 * | 6/2013 | Erdogan et al. | 345/174 |

* cited by examiner

*Primary Examiner* — Gene W Lee

(57) ABSTRACT

An analog front end circuit utilizes coherent detection within a capacitance measurement application. The analog front end circuit uses coherent detection to measure capacitance of a touch screen display. An analog excitation signal is modulated by a capacitor to be measured. The modulated signal is synchronously demodulated using a correlator, which includes an integrated mixing and integration circuit. The correlator includes a programmable impedance element that generates a time-varying conductance according to a controlling digitized waveform.

23 Claims, 7 Drawing Sheets

CONTINUOUS TIME CORRELATOR ARCHITECTURE

RELATED APPLICATIONS

This application claims priority of U.S. provisional application, Ser. No. 61/446,944, filed Feb. 25, 2011, and entitled "Mutual Capacitance Touch-Screen Controller IIC Interface", by these same inventors. This application incorporates U.S. provisional application, Ser. No. 61/446,944 in its entirety by reference.

This application is related to U.S. Patent Application Publication No. 2012/0218020 (U.S. Ser. No. 13/404,817 filed on Feb. 24, 2012) and U.S. Patent Application Publication No. 2012/0274404 (U.S. Ser. No. 13/404,722 filed on Feb. 24, 2012), both of which claim the benefit of U.S. Provisional Application No. 61/446,944 filed on Feb. 25, 2011. The disclosure of the above applications are incorporated herein by reference in their entirety.

FIELD OF THE INVENTION

This invention relates to analog front end circuits for converting measured capacitances to voltages. More specifically, this invention relates to analog front end circuits having a correlator for demodulating a measured capacitance from an excitation signal.

BACKGROUND OF THE INVENTION

Many electrical devices are incorporating touchscreen type displays. A touchscreen is a display that detects the presence, location, and pressure of a touch within the display area, generally by a finger, hand, stylus, or other pointing device. The touchscreen enables a user to interact with the display panel directly without requiring any intermediate device, rather than indirectly with a mouse or touchpad. Touchscreens can be implemented in computers or as terminals to access networks. Touchscreens are commonly found in point-of-sale systems, automated teller machines (ATMs), mobile phones, personal digital assistants (PDAs), portable game consoles, satellite navigation devices, and information appliances.

There are a number of types of touchscreen technologies. A resistive touchscreen panel is composed of several layers including two thin metallic electrically conductive and resistive layers separated by thin space. When some object touches the touchscreen panel, the layers are connected at certain point. In response to the object contact, the panel electrically acts similar to two voltage dividers with connected outputs. This causes a change in the electrical current that is registered as a touch event and sent to the controller for processing.

A capacitive touchscreen panel is coated, partially coated, or patterned with a material that conducts a continuous electrical current across a sensor. The sensor exhibits a precisely controlled field of stored electrons in both the horizontal and vertical axes to achieve capacitance. The human body is conductive; therefore, influences electric fields stored in a capacitance. When a reference capacitance of the sensor is altered by another capacitance field, such as a finger, electronic circuits located at each corner of the panel measure the resultant distortion in the reference capacitance. The measured information related to the touch event is sent to the controller for mathematical processing. Capacitive sensors can either be touched with a bare finger or with a conductive device being held by a bare hand. Capacitive sensors also work based on proximity, and do not have to be directly touched to be triggered. In most cases, direct contact to a conductive metal surface does not occur and the conductive sensor is separated from the user's body by an insulating glass or plastic layer. Devices with capacitive buttons intended to be touched by a finger can often be triggered by quickly waving the palm of the hand close to the surface without touching.

FIG. 1 illustrates an exemplary conventional capacitive touch sensor used in a capacitive touchscreen panel. Such sensors are typically formed using transparent conductors, such as ITO (Indium Tin Oxide) conductors, formed in layers. In the exemplary configuration of FIG. 1, bottom conductors form drive electrodes X0, X1, X2, X3, also referred to as drive lines, and top conductors form sense electrodes Y0, Y1, Y2, Y3, also referred to as sense lines. Each cross-point of a drive line and a sense line forms a capacitor having a measured capacitance Cm. The objective is to determine an estimate of a touch position on the capacitive touch sensor. When a finger, or other object that is grounded, is positioned on or proximate a cross-point of the sensor, there is a change in the measured capacitance Cm at that cross-point. The measured capacitance Cm is the capacitance between the sense line and the drive line at the cross-point. When the touch event occurs at the cross-point, a portion of the field lines between the sense line and the drive line are diverted to between the sense line and the finger. As such the measured capacitance Cm decreases during a touch event.

An analog front end (AFE) circuit performs signal processing on an analog signal and typically performs an analog-to-digital conversion. Analog front end circuits can be used in a variety of applications, including measuring and converting a capacitance to a corresponding voltage. FIGS. 2A and 2B illustrate a simplified schematic block diagram of a conventional analog front end circuit used for measuring a capacitance of an external capacitor and converting the measured capacitance to a corresponding voltage. In an exemplary application, the external capacitance is the charge stored in the capacitor Cm of FIG. 1. FIG. 2A illustrates the circuit in a first phase, and FIG. 2B illustrates the circuit in a second phase. During phase 1, charge to be measured is collected on the capacitor Cm. During phase 2, the charge stored on the capacitor Cm is transferred to the capacitor Cf and a corresponding voltage Vout is output.

Referring to FIG. 2A, the circuit includes the capacitor Cm, an operational amplifier 2, a switch 4, a feedback capacitor Cf, and a switch 6. A voltage at the negative input of the amplifier 2, and therefore at a first terminal of the capacitor Cm, is a virtual ground, Vvg. During phase 1, the switch 4 is connected to the reference voltage Vref, and the switch 6 is closed. Closing the switch 6 enables the capacitor Cf to completely discharge to a known zero state. The charge across the capacitor Cm is Vvg-Vref times the capacitance Cm.

During phase 2, the switch 4 is connected to ground, and the switch 6 is opened, as shown in FIG. 2B. With the switch 4 connected to ground the voltage across the capacitor Cm is zero, and all the charge on the capacitor Cm is transferred to the capacitor Cf. The output voltage Vout is a signal with amplitude dependent on the charge stored on the capacitor Cm and transferred to the capacitor Cf. The output voltage Vout can be input to an analog-to-digital converter (ADC), such as in FIG. 4, to be converted to a corresponding digital output value. Since the capacitor Cf was completely discharged during phase 1, the charge stored on capacitor Cf is determined entirely by the amount of charge transferred from the capacitor Cm. If the capacitor Cf is not completely discharged to a zero state during phase 1, then the capacitor Cf will retain the memory of its previous state.

The output voltage Vout=Vref*Cm/Cf+vn, where Vref is a known internal reference value, vn is the undesired noise measured by the system, and Cf is a known value. As such, the capacitance Cm can be determined from the known values Vref and Cf and the measured value Vout. The capacitance Cm is a varying capacitance and represents the capacitance to be measured, such as the measured capacitance of a touch screen display. As a finger touches the touch screen display, the capacitance changes, which is the external capacitance change being measured.

A problem with the circuit of FIGS. 2A and 2B relates to wide-band noise sampling. The circuit does not include any noise filtering, so any noise introduced into the system at the transition from phase 1 to phase 2 is included within the charge transferred to the capacitor Cf. This noise is represented as the component "vn" in the output voltage Vout. So not only is the output voltage Vout a measure of the capacitance Cm, but also an instantaneous sampling of the noise. Further, the dynamic range of the ADC needs to be large enough to account for the increased magnitude of the output voltage Vout due to noise. The larger dynamic range results in an ADC that has a larger area and uses more power.

FIG. 3 illustrates exemplary response curves for the circuit of FIGS. 2A and 2B. The top curve shows a sampling clock corresponding to phase 1 and phase 2. When the sample clock is high, e.g. 1V, the circuit is in phase 1 (FIG. 1), and when the sample clock is low, e.g. 0V, the circuit is in phase 2 (FIG. 2). In an exemplary application, the input is sampled on the rising edge of the sampling clock. The moment that the switches 4 and 6 are changed from phase 2 to phase 1 the voltage Vout is sampled. As shown in the middle curve of FIG. 3, there is some noise on the input signal, but its average value is substantially constant. The sampled value is expected to be constant, such as 1V, but due to the noise the actual sampled output varies about the expected constant value depending on the instantaneous noise present at the sampling time. An example of this variation on the actual sampled output is shown in the bottom curve of FIG. 3. If the instantaneous noise is high, then the actual sampled output is greater than the expected constant value, such as the portions of the sampled output curve that are above 1V. If the instantaneous noise is low, then the actual sampled output is lower than the expected constant value, such as the portions of the sampled output curve that are below 1V.

In application, a threshold voltage for determining a change in capacitance, such as a touch event on a touch screen display, is increased to accommodate the variation in the sampled output. Increasing the threshold voltage reduces the sensitivity of the system. Using a threshold voltage that is too low to account for the noise variations results in false triggers.

Various alternative systems that measure a capacitance include considerations for the noise. FIG. 4 illustrates a simplified schematic block diagram of a conventional analog front end circuit using digital filtering. The circuit of FIG. 4 includes an analog-to-digital converter (ADC) connected to the output of the low-noise amplifier (LNA). Voltage input to the ADC is converted to a digital value, which is processed by digital processing circuitry that includes noise filtering. The ADC is also a sampling system which samples at a single instant in time. This results in similar varying sampled output values as described above in relation to FIG. 3.

FIG. 5 illustrates a simplified schematic block diagram of another conventional analog front end circuit. The circuit of FIG. 5 is the same as the circuit of FIG. 4 with the addition of a band-pass filter (BPF) to filter the signal prior to inputting to the ADC. The BPF attempts to filter the noise present in the voltage signal (middle curve of FIG. 3) prior to inputting to the ADC. Sampling is performed on the filtered signal output from the BPF. The problem with the circuit of FIG. 5 is that different applications are subjected to different noise spectrums. As such, the BPF cannot be fixed, instead the BPF must be tunable to the specific application. Also, the BPF should be able to be finely tuned to accommodate applications with a relatively narrow frequency response. For example, a touch screen display may have a frequency response between about 50-400 kHz. If the BPF has too large a bandwidth, such as 50 kHz, the filter bandwidth may be too wide to effectively filter noise for certain applications.

SUMMARY OF THE INVENTION

An analog front end circuit utilizes coherent detection within a capacitance measurement application. In some applications, the analog front end circuit uses coherent detection to measure capacitance of a touch screen display. The analog front end detection circuit includes a signal generator that generates an analog excitation signal. The analog excitation signal is modulated by a capacitor to be measured. The modulated signal is synchronously demodulated using a correlator. In some embodiments, the correlator includes integrated circuitry configured to perform mixing and integrating. In some embodiments, the correlator includes a programmable impedance element coupled to a amplifier and an integrating capacitor. This programmable impedance element performs the multiplication function using a digitized waveform instead of an analog waveform. In some embodiments, the programmable impedance element includes an array of resistors coupled to a corresponding array of on-off switches. In other embodiments, the programmable impedance element includes an array of capacitors coupled to a corresponding array of on-off switches. A digitized waveform is applied to each of the array of on-off switches such that a resulting impedance of the programmable impedance element varies in time. The digitized waveform is correlated to the excitation signal.

In an aspect, a capacitance measurement circuit is disclosed. The circuit includes an external capacitor and a coherent detection circuit coupled to the external capacitor. The coherent detection circuit is configured to measure a capacitance of the external capacitor and to convert the measured capacitance to a corresponding voltage output. The coherent detection circuit includes a programmable impedance element, a first amplifier coupled to an output of the programmable impedance element, and an integrating feedback capacitor coupled to an input of the first amplifier and to an output of the first amplifier. The capacitance measurement circuit can also include a signal generator coupled to the external capacitor, wherein the signal generator is configured to generate an analog excitation signal. A modulated analog excitation signal can be input to the programmable impedance element, wherein the modulated analog signal includes the analog excitation signal modulated by a capacitance of the external capacitor. The programmable impedance element can be programmed with a time-varying conductance according to a programmed waveform such that a mixed analog signal output from the programmable impedance element is a product of the modulated signal and the programmed waveform. The programmable impedance element can include an array of resistors and an array of switches coupled to the array of resistors. Alternatively, the programmable impedance element can include an array of capacitors and an array of switches coupled to the array of capacitors. Each switch in the array of switches can be independently controlled according to a digitized control word representative of a correlation signal, wherein the correlation signal is correlated to the excitation signal. The programmable impedance element can include a voltage to current converter and a current digital to analog converter coupled to the voltage to current converter. The first amplifier and the integrating feedback capacitor can be configured to receive the mixed analog signal and to integrate the mixed analog signal over a discrete period of time to output the corresponding voltage output. The period of time can be a multiple of 1/f, where f is a frequency of the analog excitation signal.

The capacitance measurement circuit can also include a second amplifier and a second feedback capacitor coupled to an input and to an output of the second amplifier, wherein the input of the second amplifier is coupled to the external capacitor and the output of the second amplifier is coupled to the programmable impedance element. The capacitance measurement circuit can also include a touch screen display, wherein the touch screen display includes the external capacitor. The coherent detection circuit can be an analog synchronous demodulator. The programmable impedance element, the first amplifier, and the integrating feedback capacitor can form an integrated mixer and integration circuit.

In another aspect, another capacitance measurement circuit is disclosed. The capacitance measurement circuit includes a signal generator, a touch screen display having at least one capacitor, a first amplifier, a first feedback capacitor, a programmable impedance element, a second amplifier, and a second feedback capacitor. The signal generator is configured to generate an analog excitation signal. The capacitor is configured to input the analog excitation signal and to output a modulated analog excitation signal, wherein the analog excitation signal is modulated according to a capacitance of the capacitor. The first amplifier is coupled to the capacitor and the first feedback capacitor is coupled to an input and to an output of the first amplifier. The first amplifier is configured to input the modulated analog excitation signal and to output an amplified modulated analog excitation signal. The programmable impedance element is coupled to the first amplifier. The programmable impedance element is configured to input the amplified modulated analog excitation signal and to output a mixed analog signal. The programmable impedance element is programmed with a time-varying conductance according to a programmed waveform such that the mixed analog signal output from the programmable impedance element is a product of the modulated signal and the programmed waveform. The second amplifier is coupled to the programmable impedance element and the second feedback capacitor coupled to an input and to an output of the second amplifier. The second amplifier and the second feedback capacitor are configured to receive the mixed analog signal and to integrate the mixed analog signal over a discrete period of time to output a voltage signal, wherein the voltage signal corresponds to the capacitance of the capacitor.

In yet another aspect, an integrated mixing and integration circuit is disclosed. The circuit includes a programmable impedance element, an amplifier coupled to an output of the programmable impedance element, and an integrating feedback capacitor coupled to an input of the amplifier and to an output of the amplifier. The programmable impedance element is configured to receive as input a modulated signal, wherein the programmable impedance element is programmed with a time-varying conductance according to a programmed waveform such that a signal output from the programmable impedance element is a multiple of the modulated signal and the programmed waveform. The programmable impedance element can include an array of resistors and an array of switches coupled to the array of resistors.

Alternatively, the programmable impedance element can include an array of capacitors and an array of switches coupled to the array of resistors. Each switch in the array of switches can be independently controlled according to a digitized control word representative of a correlation signal, wherein the correlation signal is correlated to the excitation signal. The programmable impedance element can include a voltage to current converter and a current digital to analog converter coupled to the voltage to current converter.

In still yet another aspect, a method of measuring capacitance is disclosed. The method includes generating an analog excitation signal and applying the analog excitation signal to a capacitor to be measured, thereby modulating the analog excitation signal. The method also includes generating a time-varying conductance according to a digitized waveform, wherein the time-varying conductance is correlated to the analog excitation signal. The method further includes applying the time-varying conductance to the modulated analog excitation signal, thereby generating a mixed signal. The method further includes integrating the mixed signal over a discrete period of time thereby demodulating the modulated analog excitation signal resulting in an output voltage corresponding to a capacitance of the capacitor. The output voltage can be a DC voltage. Demodulating the modulated analog excitation signal using the correlated time-varying conductance can filter noise and interference from the modulated analog excitation signal. The capacitor can measure a capacitance of a touch screen display.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to a analog front end circuit. Those of ordinary skill in the art will realize that the following detailed description of the analog front end circuit is illustrative only and is not intended to be in any way limiting. Other embodiments of the analog front end circuit will readily suggest themselves to such skilled persons having the benefit of this disclosure.

Reference will now be made in detail to implementations of the analog front end circuit as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 6:
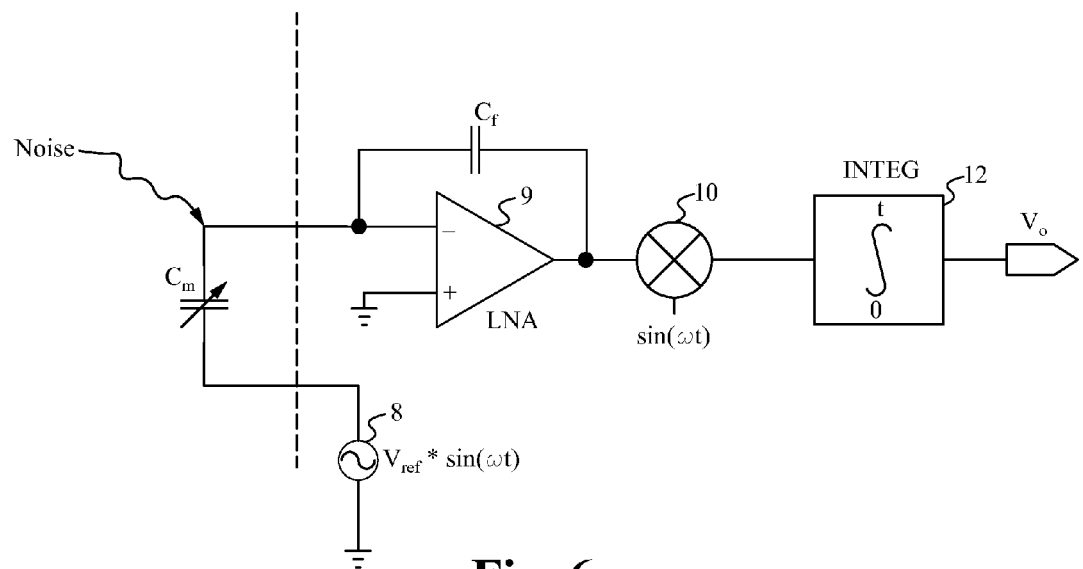
FIG. 6 illustrates a simplified schematic block diagram of an analog front end circuit using coherent detection according to a first embodiment.

In some embodiments, a capacitance measurement is performed by an analog front end circuit that uses coherent detection, also referred to as synchronous demodulation or correlation, to reject noise and/or other interferers. FIG. 6 illustrates a simplified schematic block diagram of an analog front end circuit using coherent detection according to a first embodiment. Coherent detection generally refers to transmitting a signal at a certain frequency f, and detecting the signal at that same frequency f. Signals at other frequencies are considered noise. A mixer 10 and an integrator 12 are together referred to as a correlator, which performs synchronous demodulation, or correlation, to reject noise and/or interferers. In some embodiments, a mixer includes an operational amplifier and a resistor pair including a variable resistor, where an output voltage of the mixer is a function of the input voltage multiplied by the ratio of the two resistors. In some embodiments, an integrator includes an operational amplifier, a feedback capacitor coupled to the input and output of the operational amplifier, and a resistor coupled to the input of the operational amplifier, where an output voltage of the integrator is equal to the inverse of the resistor and capacitor product multiplied by the integration of the input voltage over a period of time. Alternatively, other conventional mixer and integrator configurations can be used.

A signal generator 8 generates an excitation signal $\sin(\omega t)$, where $\omega = 2\pi f$. The excitation signal $\sin(\omega t)$ is multiplied by a reference voltage Vref. The resulting signal Vref*$\sin(\omega t)$ is modulated according to a measured capacitance of the capacitor Cm. This modulated signal is amplified by a low-noise amplifier 9, input to the mixer 10 and mixed with the original excitation signal $\sin(\omega t)$. The mixer 10 multiples the two input signals, the modulated and amplified excitation signal and the excitation signal. The multiplied signals are then integrated over a time period T by the integrator 12. The time period T is a multiple of the period 1/f. Multiplying the two sine wave signals results in a DC voltage term (Cm/2Cf) Vref plus a sine term at twice the frequency, which when integrated over a multiple of the frequency cancels out, leaving only the DC voltage term. This is the result when only an ideal signal is present. When noise is introduced, the noise is also multiplied by the excitation signal $\sin(\omega t)$ and integrated. The output voltage Vout can be represented as follows:

$$V_{out} = \frac{C_m}{2C_f} V_{ref} + \int_0^T n(t)\sin(2\pi f t)\, dt \qquad (1)$$

where T is a multiple of 1/f and the noise is represented as n(t). The integrator 12 provides a band-pass filtering function with a peak around f so that the noise, included in the second term in equation (1), is filtered out. The output voltage Vout is the DC voltage term that can be subsequently sampled using an ADC. There is no dynamic signal to be sampled.

Figure 7:
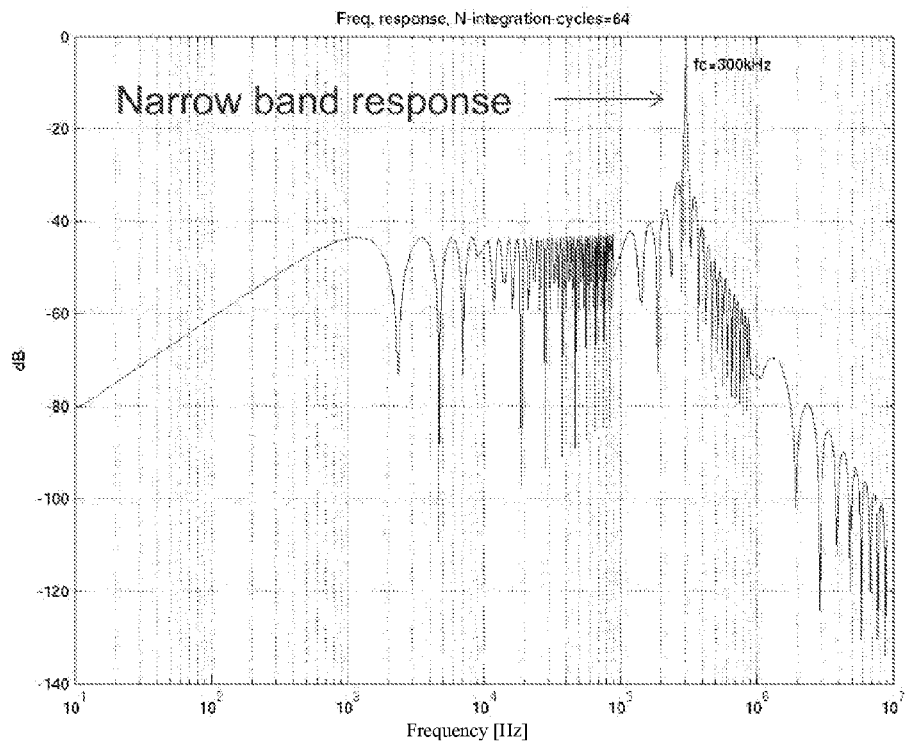
FIG. 7 illustrates an exemplary frequency response of the circuit of FIG. 6 for an excitation frequency f equal to 300 kHz.

FIG. 7 illustrates an exemplary frequency response of the circuit of FIG. 6 for an excitation frequency f equal to 300 kHz. In an exemplary application, the circuit of FIG. 6 is configured for narrow band pass filtering, and the corresponding narrow band frequency response of FIG. 7 shows that the circuit is very selective about 300 kHz. Other frequencies are filtered out.

In addition to filtering out the noise, the coherent detection circuit shown in FIG. 6 can also be easily adapted to generate excitation signals of alternate frequencies so as change the band-pass function. This tuning does not require changing the LNA, the mixer 10, or the integrator 12. The signal generator 8 is simply changed to generate the excitation signal at the alternate frequency. In contrast, the BPF component in the conventional analog front end circuit in FIG. 5, e.g. the resistors and capacitors within the BPF, need to be adjusted to change the band-pass function.

Although the above application is described above in terms of sine waves, it is understood that other waveforms can be used to apply coherent detection. Equation (1) can be generalized to:

$$V_0 = \int_0^T E(t)C(t)\, dt + \int_0^T n(t)C(t)\, dt \qquad (2)$$

where E(t) is an excitation signal supplied to the capacitor Cm and C(t) is a correlation signal input to the mixer. E(t) and C(t) can be any waveform such that E(t) and C(t) are correlated. E(t) and C(t) are chosen such that the integration of E(t)C(t) is maximized and the integration of n(t)C(t) is minimized. C(t) is selected for least correlation to noise. The time period T is a multiple of the E(t)*C(t) period.

Implementation of the mixer 10 is a non-trivial task. The mixer 10 is configured to multiply two input analog signals, the modulated and amplified excitation signal and the excitation signal. In some applications, this multiplication function is to be linear. To achieve a linear transfer function, the mixer 10 uses 10-12 bit linear multiplier. Such a mixer is difficult to build and is expensive.

Figure 8:
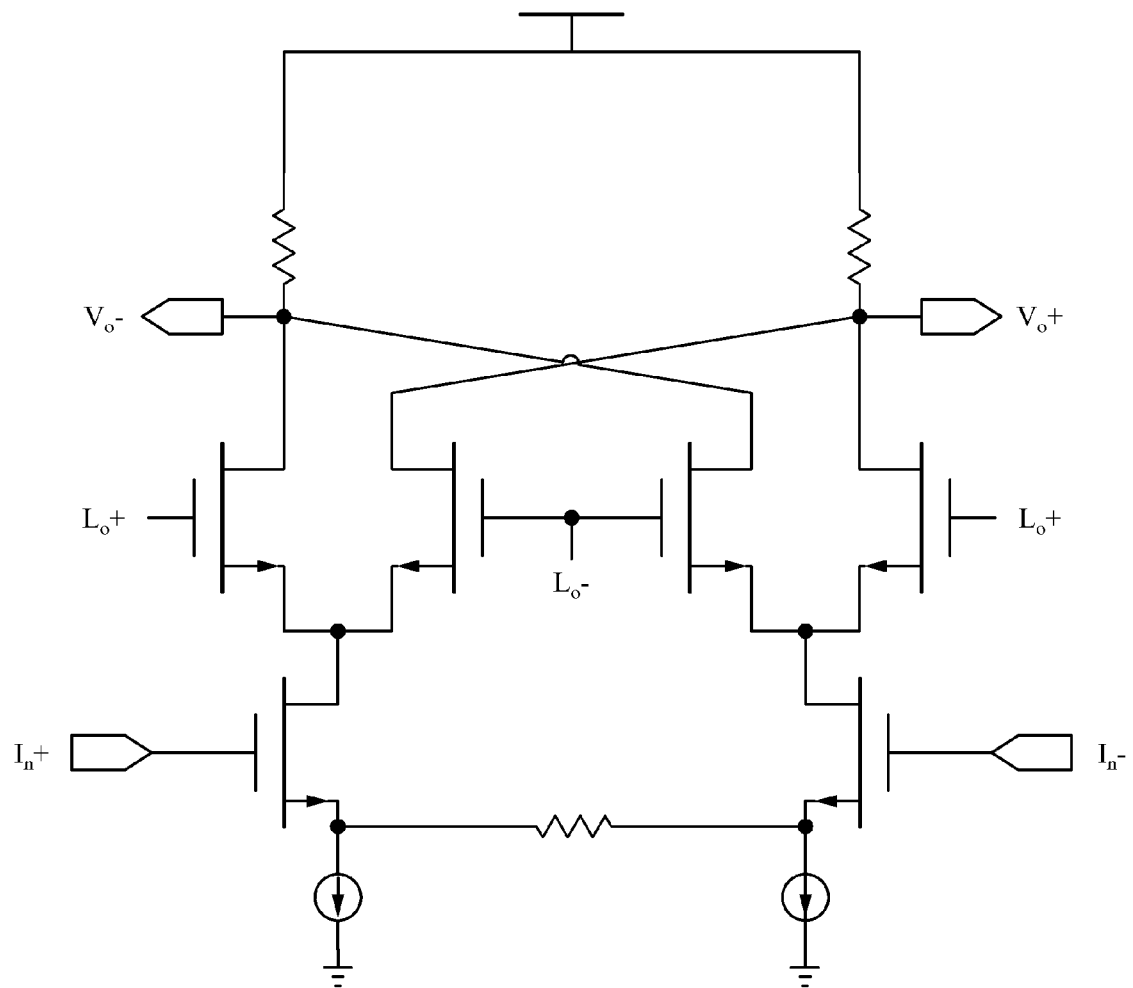
FIG. 8 illustrates a schematic circuit diagram of an exemplary mixing circuit according to an embodiment.

FIG. 8 illustrates a schematic circuit diagram of an exemplary mixing circuit according to an embodiment. The mixing circuit includes two input ports, an In port and an LO port. The In port receives the modulated signal output from the amplifier 9 (FIG. 6). The LO port receives the original excitation signal $\sin(\omega t)$. Plus and minus ports represent a differential signal, as is well known in the art. The In port can be made linear, but the LO port is simply a switch that provides a square wave response. This provides limited rejection of undesired signals at the harmonics of the desired frequency. For example, 3rd harmonic of a square wave is only 8 dB below the fundamental; therefore, interference at 3*f would only see 8 dB attenuation.

In an alternative configuration, the function of the mixer and the integrator are combined and simplified so as to reduce the complexity associated with performing linear multiplication. Using a simplified description, a mixer can include an operational amplifier and a resistor pair including a variable resistor, where an output voltage of the mixer is a function of the input voltage multiplied by the ratio of the two resistors. An integrator includes an operational amplifier, a feedback capacitor coupled to the input and output of the operational amplifier, and a resistor coupled to the input of the operational amplifier, where an output voltage of the integrator is equal to the inverse of the resistor and capacitor product multiplied by the integration of the input voltage over a period of time. Notice is taken of the quantity 1/R in the aforementioned relationship between the input voltage and the output voltage of the integrator. Since a multiplying function is needed to mix the modulated excitation signal and the excitation signal, such as the function performed by the mixer 10 in FIG. 6, if the quantity 1/R can be appropriately modulated, the resistive element can be used to perform the multiplying function. A programmable resistive element can be used to perform this function. Instead of discrete mixing and integrator circuits, the two functions are combined as a single integrated circuit that includes a single operational amplifier, a capacitor, and a programmable resistive element.

Figure 9:
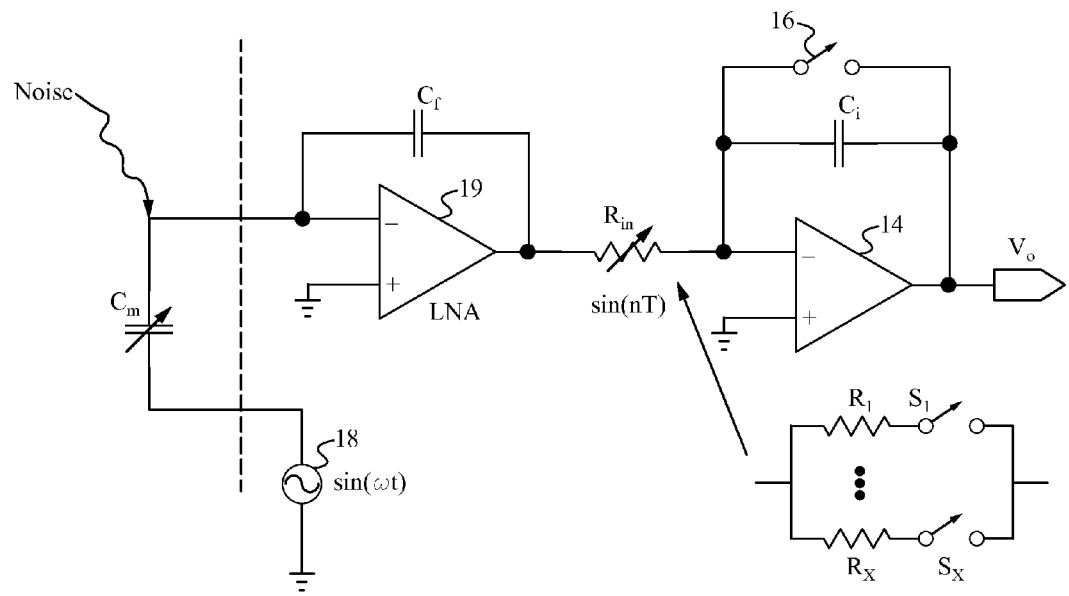
FIG. 9 illustrates a simplified schematic block diagram of an analog front end circuit using coherent detection according to a second embodiment.

FIG. 9 illustrates a simplified schematic block diagram of an analog front end circuit using coherent detection according to a second embodiment. A programmable resistive element Rin, an amplifier 14, and an integrating feedback capacitor Ci form an integrated circuit having the combined functionality of a mixer and an integrator. The programmable resistive element is represented in FIG. 9 as Rin with an arrow. In some embodiments, the programmable resistive element Rin is implemented as a digital array of resistors, shown in the expanded area in FIG. 9 as an array of resistors R1-Rx. Each resistor R1-Rx in the array is coupled to a corresponding on-off switch S1-Sx. One or more of the resistors R1-Rx in the array can be turned on such that the overall conductance of the programmable resistive element Rin imitates a desired waveform, such as a sine wave. In this manner, an appropriate combination of resistors in the array of resistors R1-Rx can be turned on to represent the multiplication of the modulated excitation signal and the excitation signal, thereby performing the multiplication function previously performed by the mixer 10 in FIG. 6.

The switches S1-Sx are controlled by a digitized waveform, such as a digitized sine wave. The conductance G(t) of the programmable resistive element Rin is equal to 1/R(t), which is proportional to the sine wave, where R(t) is the overall resistance of all turned on resistors in the array of resistors R1-Rx. The signal to be digitized is a correlation signal, which is correlated to the excitation signal generated by the signal generator 18. In an exemplary application, the sine wave sin(ωt) is digitized. The resulting digital word is used to control the digital switches S1-Sx. This results in a conductance of the programmable resistor Rin that has the characteristic of a sine wave, represented as a digitized sine wave sin(nT), shown in FIG. 7, where "nT" indicates the sine wave is quantized, both in value and in time. The digitized sine wave sin(nT) is a summation of the piece-wise components of the programmable resistor array over the integration time period T. The time period T is a multiple of the period 1/f. The digitized sine wave sin(nT) can be stored in memory and subsequently retrieved for application to the digital switches S1-Sx.

The modulated excitation signal input to the programmable resistive element Rin is also shaped like a sine wave, and as such the result at the output of the programmable resistive element Rin is a multiplied value, which is then integrated according to the operational amplifier 14 and the integrating feedback capacitor Ci. The voltage Vout output from the integration is provided as input to an ADC (not shown) and subsequently processed. The ADC samples the voltage Vout every period of time, for example every 10 microseconds. After the voltage Vout is sampled, the integrating feedback capacitor Ci is discharged by closing the switch 16. After discharge, the switch 16 is opened for the next cycle defined by the integrating time period T.

The analog front end circuits of FIGS. 6 and 9 utilize coherent detection within a capacitance measurement application. In an exemplary application, the analog front end circuit uses coherent detection to measure capacitance of a touch screen display. The analog front end circuit provides excellent noise and interference immunity, and also provides a higher signal to noise ratio.

The analog front end circuit of FIG. 9 combines the functionality of a conventional mixer and integrator by using a programmable resistive element. This combined circuitry performs the multiplication function using a digitized waveform instead of an analog waveform. The digitized waveform is much easier to generate than the analog waveform. Additionally, the combined functionality is performed using a single operational amplifier, as opposed to using a discrete mixer having a first operational amplifier and a discrete integrator having a second operational amplifier.

The analog front end circuits of FIGS. 6 and 9 provide a continuous time signal path, there is no discrete sampling function performed where sampling is performed and then the charge across the capacitor is discharged. The signal continuously flows through the mixer and the integrator of FIG. 6, or through the programmable resistive element and the integrating capacitor of FIG. 9, and because of this there is no aliasing due to time instant sampling. Anti-aliasing is done within the correlator. There is no need for a separate anti-aliasing filter.

The analog front end circuit of FIG. 9 has good linearity because the resistors in the programmable resistive element Rin and the integrating feedback capacitor Ci are very linear.

Figure 4:
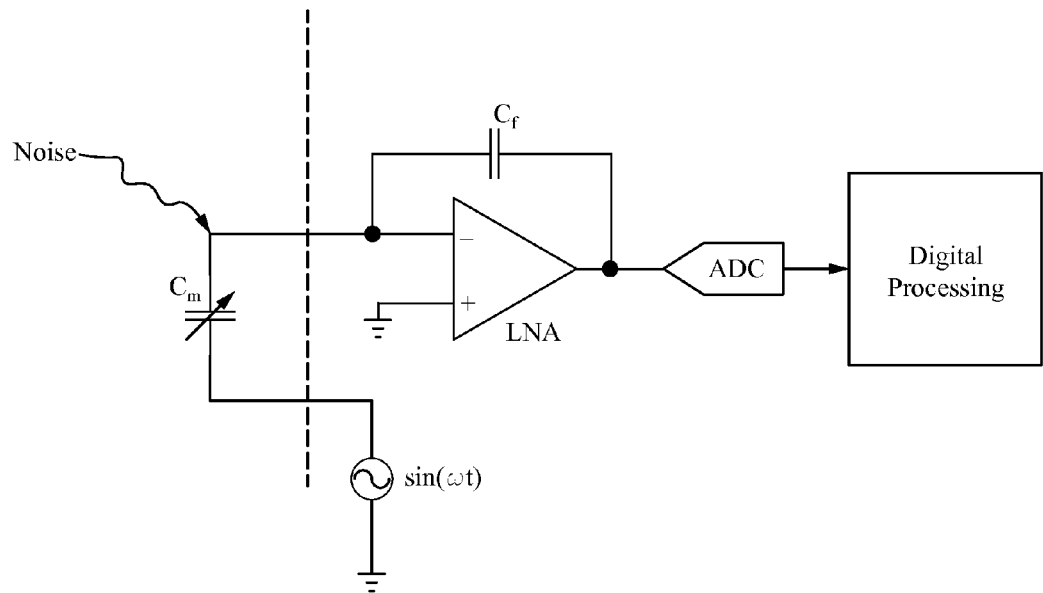
FIG. 4 illustrates a simplified schematic block diagram of a conventional analog front end circuit using digital filtering.
Figure 5:
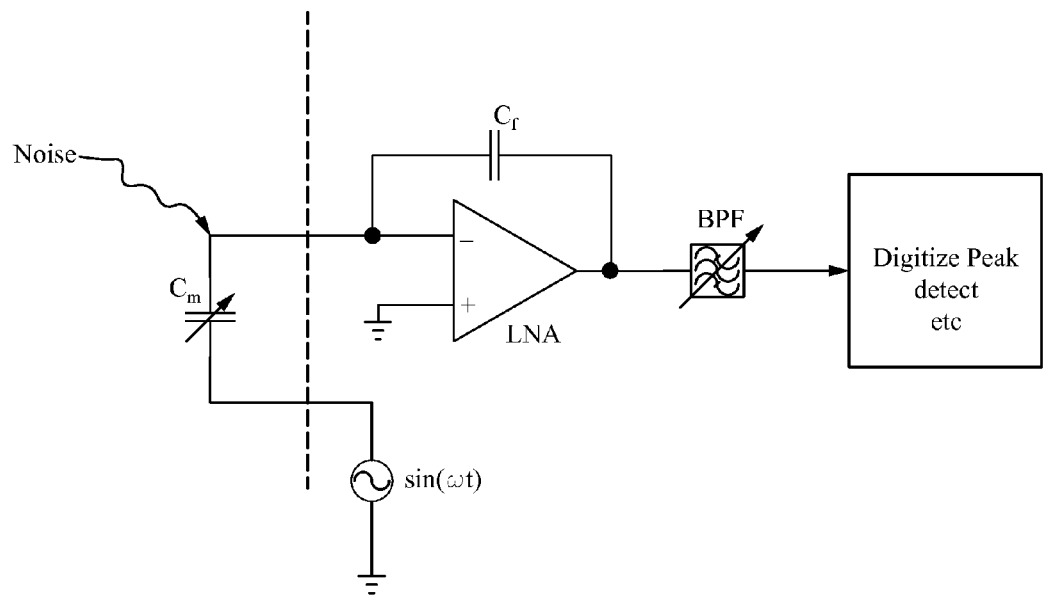
FIG. 5 illustrates a simplified schematic block diagram of another conventional analog front end circuit.

The analog front end circuits of FIGS. 6 and 9 use less power than the conventional analog front end circuits, such as the analog front end circuits of FIGS. 4 and 5. An ADC coupled to the analog front end circuits of FIGS. 6 and 9 does not require as much power as an ADC, such as the ADC used in FIG. 4, that is sampling an active analog signal. The ADC coupled to the analog front end circuits of FIGS. 6 and 9 can be slower and less precise. Also, performing the multiplication function using the programmable resistive element, as in FIG. 9, uses less power and has a smaller area than using a discrete mixing circuit, as in FIG. 6.

The analog front end circuits are described above as being applied to a touch screen application. Alternative applications are also contemplated.

Figure 10:
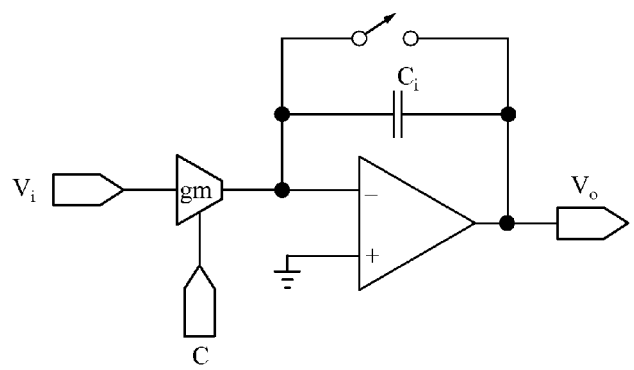
FIG. 10 illustrates a schematic diagram of an integrated mixing and integrating circuit including a transconductor as the time-varying impedance element according to an embodiment.

The integrated mixer and integrator is shown in FIG. 9 as including a programmable resistor array coupled to an amplifier and feedback capacitor. This concept can be generalized to use a time-varying impedance element that changes in response to an input control. The time-varying impedance element is coupled to the amplifier and feedback capacitor.
FIG. 10 illustrates a schematic diagram of an integrated mixing and integrating circuit including a transconductor as the time-varying impedance element according to an embodiment. The transconductor has a programmable transconductance gm that is controlled using digital or analog control C. The transconductance gm can be changed over time to achieve a multiplication operation.

Figure 11:
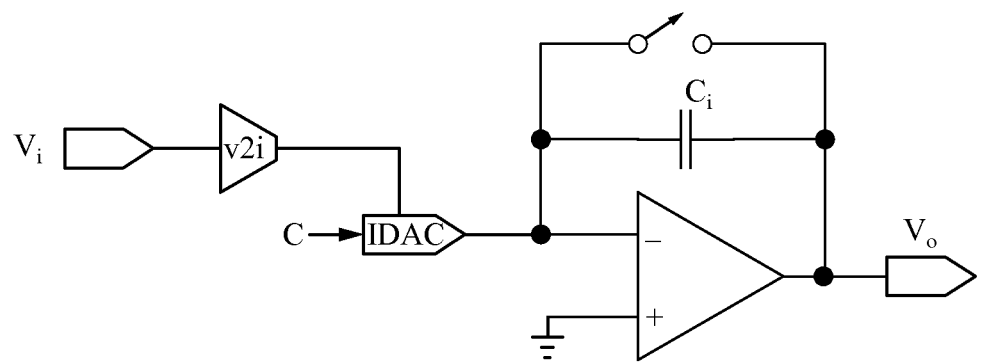
FIG. 11 illustrates a schematic diagram of an integrated mixing and integrating circuit including a current digital to analog converter (IDAC) as the time-varying impedance element according to an embodiment.

FIG. 11 illustrates a schematic diagram of an integrated mixing and integrating circuit including a voltage to current converter v2i and a current digital to analog converter (IDAC) as the time-varying impedance element according to an embodiment. The voltage to current converter v2i converts an input voltage to a corresponding current, which is supplied to the IDAC. The IDAC has a programmable gain that is controlled using digital or analog control C. The effective impedance can be changed over time to achieve a multiplication operation.

Figure 12:
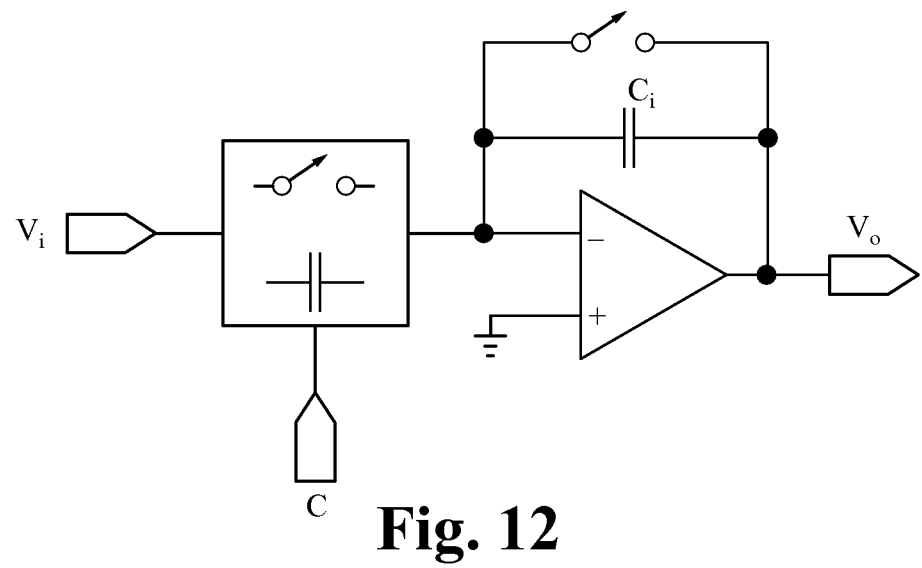
FIG. 12 illustrates a schematic diagram of an integrated mixing and integrating circuit including a programmable capacitive element as the time-varying impedance element according to an embodiment.

FIG. 12 illustrates a schematic diagram of an integrated mixing and integrating circuit including a programmable capacitive element as the time-varying impedance element according to an embodiment. The programmable capacitive element functions similarly as the programmable resistive element of FIG. 9 except for the use of capacitors instead of resistors. The capacitors in the programmable capacitive element are turned on or off to achieve a desired time-varying gain, which functions as the multiplication operation in the integrated mixing and integration circuit.

The integrated mixing and integrating circuits shown in FIGS. 9-12 can be used in applications alternative to touch screens including, but not limited to, radio frequency and thermal applications.

The present application has been described in terms of specific embodiments incorporating details to facilitate the understanding of the principles of construction and operation of the analog front end circuit. Many of the components shown and described in the various figures can be interchanged to achieve the results necessary, and this description should be read to encompass such interchange as well. As such, references herein to specific embodiments and details thereof are not intended to the scope of the claims appended hereto. It will be apparent to those skilled in the art that modifications can be made to the embodiments chosen for illustration without departing from the spirit and scope of the application.

What is claimed:

1. A capacitance measurement circuit comprising:
   an external capacitor; and
   a coherent detection circuit coupled to the external capacitor and configured to measure a capacitance of the external capacitor and to convert the measured capacitance to a corresponding voltage output, wherein the coherent detection circuit comprises a programmable impedance element, a first amplifier coupled to an output of the programmable impedance element, and an integrating feedback capacitor coupled to an input of the first amplifier and to an output of the first amplifier; and
   a signal generator coupled to the external capacitor, wherein the signal generator is configured to generate an analog excitation signal that is modulated by the capacitance of the external capacitor,
   wherein the modulated analog excitation signal is input to the programmable impedance element, and
   wherein the programmable impedance element is programmed with a time-varying conductance according to a programmed waveform such that a mixed analog signal output from the programmable impedance element is a product of the modulated signal and the programmed waveform.

2. The capacitance measurement circuit of claim 1 wherein the programmable impedance element comprises an array of resistors and an array of switches coupled to the array of resistors.

3. The capacitance measurement circuit of claim 2 wherein each switch in the array of switches is independently controlled according to a digitized control word representative of a correlation signal, wherein the correlation signal is correlated to the excitation signal.

4. The capacitance measurement circuit of claim 1 wherein the programmable impedance element comprises an array of capacitors and an array of switches coupled to the array of capacitors.

5. The capacitance measurement circuit of claim 4 wherein each switch in the array of switches is independently controlled according to a digitized control word representative of a correlation signal, wherein the correlation signal is correlated to the excitation signal.

6. The capacitance measurement circuit of claim 1 wherein the programmable impedance element comprises a voltage to current converter and a current digital to analog converter coupled to the voltage to current converter.

7. The capacitance measurement circuit of claim 1 wherein the first amplifier and the integrating feedback capacitor are configured to receive the mixed analog signal and to integrate the mixed analog signal over a discrete period of time to output the corresponding voltage output.

8. The capacitance measurement circuit of claim 7 wherein the discrete period of time is a multiple of 1/f, where f is a frequency of the analog excitation signal.

9. The capacitance measurement circuit of claim 1 further comprising a second amplifier and a second feedback capacitor coupled to an input and to an output of the second amplifier, wherein the input of the second amplifier is coupled to the external capacitor and the output of the second amplifier is coupled to the programmable impedance element.

10. The capacitance measurement circuit of claim 1 further comprising a touch screen display, wherein the touch screen display includes the external capacitor.

11. The capacitance measurement circuit of claim 1 wherein the coherent detection circuit comprises an analog synchronous demodulator.

12. The capacitance measurement circuit of claim 1 wherein the programmable impedance element, the first amplifier, and the integrating feedback capacitor form an integrated mixer and integration circuit.

13. A capacitance measurement circuit comprising:
   a signal generator configured to generate an analog excitation signal;
   a touch screen display having at least one capacitor, wherein the capacitor is configured to input the analog excitation signal and to output a modulated analog excitation signal, wherein the analog excitation signal is modulated according to a capacitance of the capacitor;
   a first amplifier coupled to the capacitor and a first feedback capacitor coupled to an input and to an output of the first amplifier, wherein the first amplifier is configured to input the modulated analog excitation signal and to output an amplified modulated analog excitation signal;
   a programmable impedance element coupled to the first amplifier, wherein the programmable impedance element is configured to input the amplified modulated analog excitation signal and to output a mixed analog signal, further wherein the programmable impedance element is programmed with a time-varying conductance according to a programmed waveform such that the mixed analog signal output from the programmable impedance element is a product of the modulated signal and the programmed waveform; and a second amplifier coupled to the programmable impedance element and a second feedback capacitor coupled to an input and to an output of the second amplifier, wherein the second amplifier and the second feedback capacitor are configured to receive the mixed analog signal and to integrate the mixed analog signal over a discrete period of time to output a voltage signal, wherein the voltage signal corresponds to the capacitance of the capacitor.

14. An integrated mixing and integration circuit comprising:

a programmable impedance element configured to receive as input a modulated signal, wherein the programmable impedance element is programmed with a time-varying conductance according to a programmed waveform such that a signal output from the programmable impedance element is a multiple of the modulated signal and the programmed waveform;

an amplifier coupled to an output of the programmable impedance element; and an integrating feedback capacitor coupled to an input of the amplifier and to an output of the amplifier.

15. The integrated mixing and integration circuit of claim 14 wherein the programmable impedance element comprises an array of resistors and an array of switches coupled to the array of resistors.

16. The integrated mixing and integration circuit of claim 15 wherein each switch in the array of switches is independently controlled according to a digitized control word representative of a correlation signal, wherein the correlation signal is correlated to an excitation signal.

17. The integrated mixing and integration circuit of claim 14 wherein the programmable impedance element comprises an array of capacitors and an army of switches coupled to the array of capacitors.

18. The integrated mixing and integration circuit of claim 17 wherein each switch in the array of switches is independently controlled according to a digitized control word representative of a correlation signal, wherein the correlation signal is correlated to an excitation signal.

19. The integrated mixing and integration circuit of claim 14 wherein the programmable impedance element comprises a voltage to current converter and a current digital to analog converter coupled to the voltage to current converter.

20. A method of measuring capacitance, the method comprising:

generating an analog excitation signal;

applying the analog excitation signal to a capacitor to be measured, thereby modulating the analog excitation signal;

generating a time-varying conductance via a programmable impedance element according to a digitized waveform, wherein the time-varying conductance is correlated to the analog excitation signal;

applying the time-varying conductance to the modulated analog excitation signal, thereby generating a mixed signal; and integrating the mixed signal over a discrete period of time thereby demodulating the modulated analog excitation signal resulting in an output voltage corresponding to a capacitance of the capacitor.

21. The method of claim 20 wherein the output voltage comprises a DC voltage.

22. The method of claim 20 wherein demodulating the modulated analog excitation signal using the correlated time-varying conductance filters noise and interference from the modulated analog excitation signal.

23. The method of claim 20 wherein the capacitor measures a capacitance of a touch screen display.

* * * * *

UNITED STATES PATENT AND TRADEMARK OFFICE
CERTIFICATE OF CORRECTION

| | |
|---|---|
| PATENT NO. | : 8,643,619 B2 |
| APPLICATION NO. | : 13/404594 |
| DATED | : February 4, 2014 |
| INVENTOR(S) | : Ozan E. Erdogan |

Page 1 of 3

Figure 1:
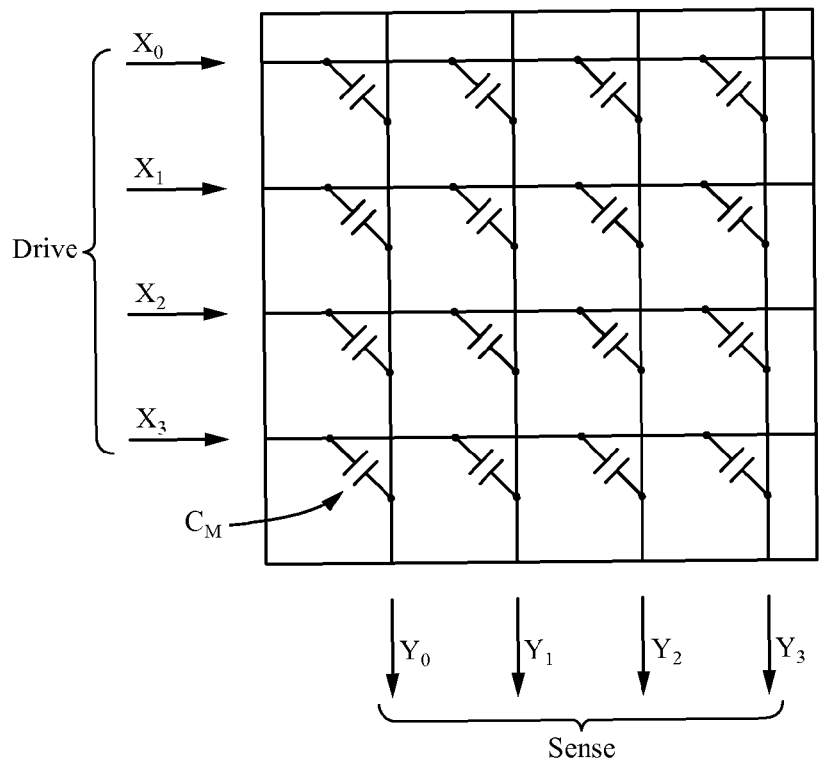
FIG. 1 illustrates an exemplary conventional capacitive touch sensor used in a capacitive touchscreen panel.
Figure 2A:
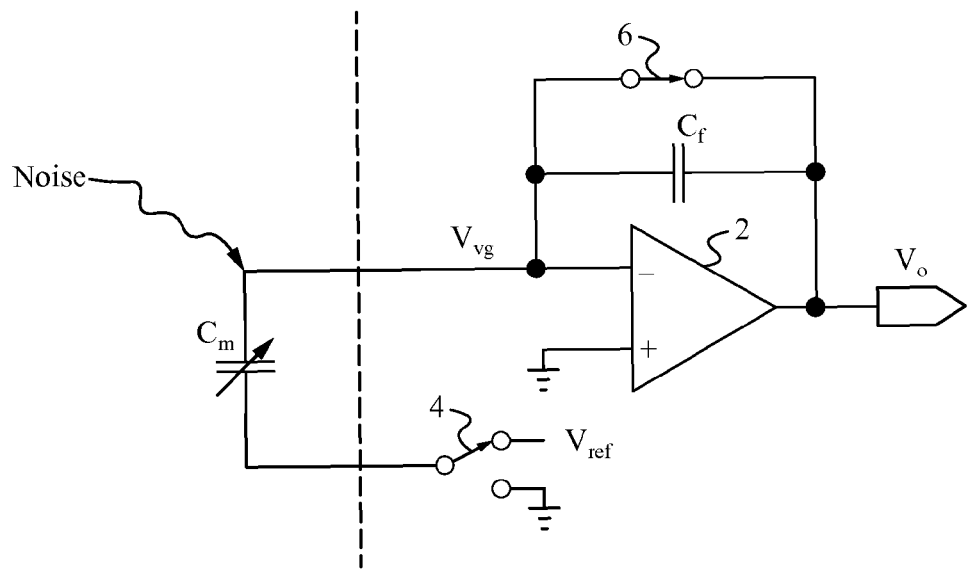
FIGS. 2A and 2B illustrate a simplified schematic block diagram of a conventional analog front end circuit used for measuring a capacitance of an external capacitor and converting the measured capacitance to a corresponding voltage.
Figure 2B:
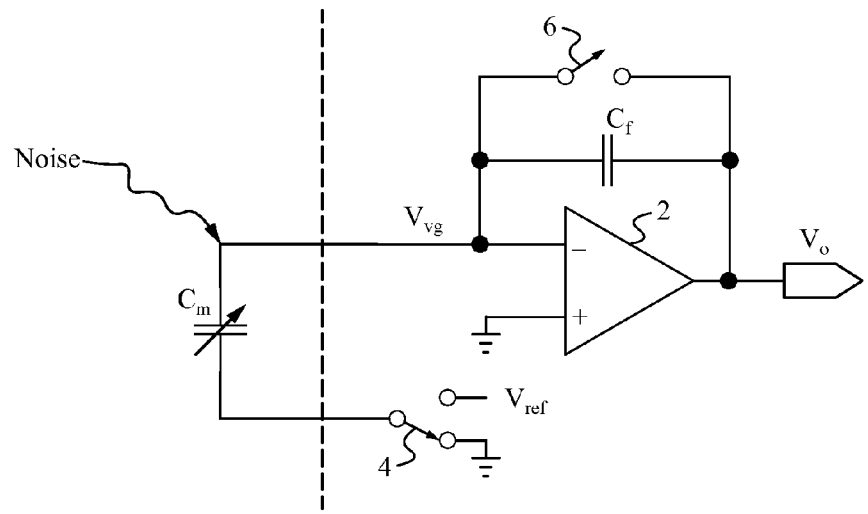
Figure 3:
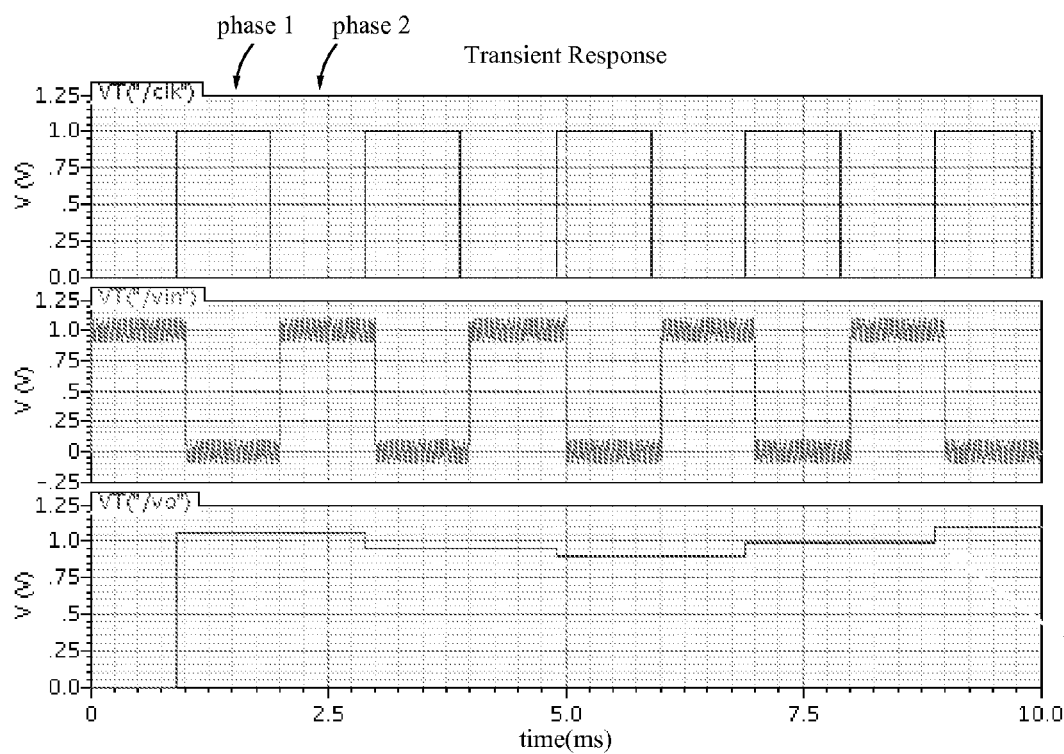
FIG. 3 illustrates exemplary response curves for the circuit of FIGS. 2A and 2B.

It is certified that error appears in the above-identified patent and that said Letters Patent is hereby corrected as shown below:

In the Drawings:
Sheet 1 of 7, Fig. 1      Delete "$C_M$" and insert --$C_m$--

In the Specification:
Column 2, Line 12         Delete "X0, X1, X2, X3," and insert --$X_0$, $X_1$, $X_2$, $X_3$,--
Column 2, Lines 13-14     Delete "Y0, Y1, Y2, Y3," and insert --$Y_0$, $Y_1$, $Y_2$, $Y_3$,--
Column 2, Line 16         Delete "Cm." and insert --$C_m$.--
Column 2, Line 20         Delete "Cm" and insert --$C_m$--
Column 2, Line 21         Delete "Cm" and insert --$C_m$--
Column 2, Line 25         Delete "Cm" and insert --$C_m$--
Column 2, Line 37         Delete "Cm" and insert --$C_m$--
Column 2, Line 40         Delete "Cm." and insert --$C_m$.--
Column 2, Line 41         Delete "Cm" and insert --$C_m$--
Column 2, Line 41         Delete "Cf" and insert --$C_f$--
Column 2, Line 42         Delete "Vout" and insert --$V_{out}$--
Column 2, Line 43         Delete "Cm," and insert --$C_m$,--
Column 2, Line 45         Delete "Cf," and insert --$C_f$,--
Column 2, Line 47         Delete "Cm," and insert --$C_m$,--
Column 2, Line 47         Delete "Vvg." and insert --$V_{vg}$.--
Column 2, Line 48         Delete "Vref," and insert --$V_{ref}$,--
Column 2, Line 49         Delete "Cf" and insert --$C_f$--
Column 2, Line 51         Delete "Cm" and insert --$C_m$--
Column 2, Line 51         Delete "Vvg-Vref" and insert --$V_{vg}$-$V_{ref}$--
Column 2, Line 51         Delete "Cm." and insert --$C_m$.--
Column 2, Line 54         Delete "Cm" and insert --$C_m$--
Column 2, Line 55         Delete "Cm" and insert --$C_m$--
Column 2, Line 56         Delete "Cf." and insert --$C_f$.--
Column 2, Line 56         Delete "Vout" and insert --$V_{out}$--
Column 2, Line 58         Delete "Cm" and insert --$C_m$--

Signed and Sealed this
Twenty-sixth Day of August, 2014

Michelle K. Lee
*Deputy Director of the United States Patent and Trademark Office*

CERTIFICATE OF CORRECTION (continued)
U.S. Pat. No. 8,643,619 B2

| | |
|---|---|
| Column 2, Line 58 | Delete "Cf." and insert --$C_f$.-- |
| Column 2, Line 59 | Delete "Vout" and insert --$V_{out}$-- |
| Column 2, Line 61 | Delete "Cf" and insert --$C_f$-- |
| Column 2, Line 62 | Delete "Cf" and insert --$C_f$-- |
| Column 2, Line 64 | Delete "Cm." and insert --$C_m$.-- |
| Column 2, Line 64 | Delete "Cf" and insert --$C_f$-- |
| Column 2, Line 65 | Delete "Cf" and insert --$C_f$-- |
| Column 3, Line 1 | Delete "Vout=Vref*Cm/Cf+vn," and insert --$V_{out}=V_{ref}*C_m/C_f+vn$,-- |
| Column 3, Line 1 | Delete "Vref" and insert --$V_{ref}$-- |
| Column 3, Line 3 | Delete "Cf" and insert --$C_f$-- |
| Column 3, Line 4 | Delete "Cm" and insert --$C_m$-- |
| Column 3, Line 5 | Delete "Vref" and insert --$V_{ref}$-- |
| Column 3, Line 5 | Delete "Cf" and insert --$C_f$-- |
| Column 3, Line 5 | Delete "Vout." and insert --$V_{out}$.-- |
| Column 3, Line 6 | Delete "Cm" and insert --$C_m$-- |
| Column 3, Line 15 | Delete "Cf." and insert --$C_f$.-- |
| Column 3, Line 16 | Delete "Vout." and insert --$V_{out}$.-- |
| Column 3, Line 17 | Delete "Vout" and insert --$V_{out}$-- |
| Column 3, Line 18 | Delete "Cm," and insert --$C_m$,-- |
| Column 3, Line 21 | Delete "Vout" and insert --$V_{out}$-- |
| Column 3, Line 30 | Delete "Vout" and insert --$V_{out}$-- |
| Column 7, Line 60 | Delete "Vref." and insert --$V_{ref}$.-- |
| Column 7, Line 62 | Delete "Cm." and insert --$C_m$.-- |
| Column 8, Lines 2-3 | Delete "(Cm/2Cf)Vref" and insert --$(C_m/2C_f)V_{ref}$-- |
| Column 8, Line 8 | Delete "Vout" and insert --$V_{out}$-- |
| Column 8, Line 18 | Delete "Vout" and insert --$V_{out}$-- |
| Column 8, Line 48 | Delete "Cm" and insert --$C_m$-- |
| Column 9, Line 36 | Delete "Rin," and insert --$R_{in}$,-- |
| Column 9, Line 36 | Delete "Ci" and insert --$C_i$-- |
| Column 9, Line 39 | Delete "Rin" and insert --$R_{in}$-- |
| Column 9, Line 40 | Delete "Rin" and insert --$R_{in}$-- |
| Column 9, Line 42 | Delete "R1-Rx." and insert --$R_1$-$R_x$.-- |
| Column 9, Line 43 | Delete "R1-Rx" and insert --$R_1$-$R_x$-- |
| Column 9, Line 44 | Delete "S1-Sx." and insert --$S_1$-$S_x$.-- |
| Column 9, Line 44 | Delete "R1-Rx" and insert --$R_1$-$R_x$-- |
| Column 9, Line 46 | Delete "Rin" and insert --$R_{in}$-- |
| Column 9, Line 48 | Delete "R1-Rx" and insert --$R_1$-$R_x$-- |
| Column 9, Line 53 | Delete "S1-Sx" and insert --$S_1$-$S_x$-- |
| Column 9, Line 58 | Delete "R1-Rx." and insert --$R_1$-$R_x$.-- |
| Column 9, Line 62 | Delete "S1-Sx." and insert --$S_1$-$S_x$.-- |
| Column 9, Line 63 | Delete "Rin" and insert --$R_{in}$-- |
| Column 10, Line 5 | Delete "S1-Sx." and insert --$S_1$-$S_x$.-- |
| Column 10, Line 7 | Delete "Rin" and insert --$R_{in}$-- |
| Column 10, Line 9 | Delete "Rin" and insert --$R_{in}$-- |
| Column 10, Line 11 | Delete "Ci." and insert --$C_i$.-- |

CERTIFICATE OF CORRECTION (continued)
U.S. Pat. No. 8,643,619 B2

| | |
|---|---|
| Column 10, Line 11 | Delete "Vout" and insert --$V_{out}$-- |
| Column 10, Line 14 | Delete "Vout" and insert --$V_{out}$-- |
| Column 10, Line 15 | Delete "Vout" and insert --$V_{out}$-- |
| Column 10, Line 16 | Delete "Ci" and insert --$C_i$-- |
| Column 10, Line 48 | Delete "Rin" and insert --$R_{in}$-- |
| Column 10, Line 48 | Delete "Ci" and insert --$C_i$-- |
| Column 11, Line 41 | After "to", insert --limit-- |

In the Claims:

| | |
|---|---|
| Column 14, Line 3, Claim 17 | Delete "army" and insert --array-- |